(12) United States Patent
Guo

(10) Patent No.: US 12,291,655 B2
(45) Date of Patent: May 6, 2025

(54) POLISHING COMPOSITION AND METHOD OF POLISHING A SUBSTRATE HAVING ENHANCED DEFECT REDUCTION

(71) Applicant: Rohm and Haas Electronic Materials CMP Holdings, Inc., Newark, DE (US)

(72) Inventor: Yi Guo, Newark, DE (US)

(73) Assignee: DuPont Electronic Materials Holding, Inc., Newark, DE (US)

( * ) Notice: Subject to any disclaimer, the term of this patent is extended or adjusted under 35 U.S.C. 154(b) by 0 days.

(21) Appl. No.: 17/241,399

(22) Filed: Apr. 27, 2021

(65) Prior Publication Data
US 2022/0348788 A1 Nov. 3, 2022

(51) Int. Cl.
C09G 1/02 (2006.01)
C09K 13/00 (2006.01)
C09K 13/02 (2006.01)
H01L 21/3105 (2006.01)

(52) U.S. Cl.
CPC ................ C09G 1/02 (2013.01); C09K 13/00 (2013.01); C09K 13/02 (2013.01); H01L 21/31053 (2013.01)

(58) Field of Classification Search
CPC .......... C09G 1/02; C09K 13/00; C09K 13/02; H01L 21/31053
USPC .............................. 438/690–693; 51/307–309
See application file for complete search history.

(56) References Cited

U.S. PATENT DOCUMENTS

| | | | |
|---|---|---|---|
| 8,252,687 B2 * | 8/2012 | Li | H01L 21/3212 |
| | | | 438/692 |
| 8,545,715 B1 * | 10/2013 | Wang | H01L 21/7684 |
| | | | 438/693 |
| 9,129,907 B2 | 9/2015 | White et al. | |
| 10,604,678 B1 | 3/2020 | Ho et al. | |
| 2002/0170237 A1 | 11/2002 | Vogt et al. | |
| 2009/0223136 A1 | 9/2009 | Nakajo et al. | |
| 2017/0247574 A1 * | 8/2017 | Takahashi | C09K 3/1436 |
| 2020/0024482 A1 * | 1/2020 | Takai | C09G 1/00 |
| 2020/0172760 A1 * | 6/2020 | Kraft | C09G 1/04 |

FOREIGN PATENT DOCUMENTS

| | | | | |
|---|---|---|---|---|
| JP | 2000311874 A | * | 11/2000 | ........... H01L 21/304 |
| TW | 201726880 A | * | 8/2017 | ............. B24B 37/00 |
| WO | WO-2017047307 A1 | * | 3/2017 | ............. B24B 37/00 |

OTHER PUBLICATIONS

Search report for corresponding application in China, 202210436744.2 dated May 24, 2023.

* cited by examiner

Primary Examiner — Duy Vu N Deo
(74) Attorney, Agent, or Firm — John J. Piskorski; Blake T. Biederman

(57) ABSTRACT

An aqueous alkaline chemical mechanical polishing composition includes a quaternary ammonium compound having a phenyl group which enables enhanced reduction of defects on silicon oxide substrates and enables good silicon oxide removal rates during chemical mechanical polishing.

4 Claims, No Drawings

POLISHING COMPOSITION AND METHOD OF POLISHING A SUBSTRATE HAVING ENHANCED DEFECT REDUCTION

FIELD OF THE INVENTION

The present invention is directed to an alkaline polishing composition and method of polishing a substrate having enhanced defect reduction with good dielectric removal rates. More specifically, the present invention is directed to an alkaline polishing composition and method of polishing a substrate having enhanced defect reduction with good dielectric removal rates, wherein the polishing composition includes quaternary ammonium compounds having a phenyl group to enhance the reduction of defects on substrates which include dielectrics of silicon oxide, and wherein at least some of the silicon oxide is removed from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by several deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Certain advanced device designs demand polishing compositions that provide enhanced silicon oxide removal efficiency at lower point-of-use (POU) abrasive weight % as well as reduced scratch defects for the improvement of polishing processes throughout and product yield %. As the size of structures on semiconductors devices continue to shrink, performance criteria which was once acceptable for planarizing and reducing defects of polishing dielectric materials becomes increasingly less acceptable. Scratches which were once considered acceptable are today becoming yield limiting.

Accordingly, there is a need for polishing compositions and polishing methods that exhibit desirable planarization efficiency, uniformity, and dielectric removal rate while minimizing defects such as scratches.

SUMMARY OF THE INVENTION

The present invention provides a chemical mechanical polishing composition comprising: water; an abrasive; optionally a pH adjusting agent; optionally a biocide; a pH greater than 7; and a quaternary ammonium compound having formula (I):

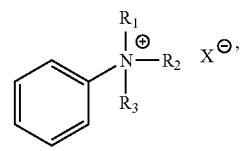

(I)

wherein $R_1$, $R_2$, and $R_3$ are independently selected from the group consisting of phenyl, benzyl, and linear or branched $C_1$-$C_5$ alkyl; and $X^-$ is an anion selected from the group consisting of $Br^-$, $Cl^-$, $I^-$, $F^-$ and $OH^-$.

The present invention also provides a chemical mechanical polishing composition comprising: water; 0.1 to 40 wt % of an abrasive; optionally a pH adjusting agent; optionally a biocide; a pH greater than 7; 0.001 to 1 wt % of a quaternary ammonium compound having formula (I):

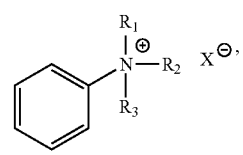

(I)

wherein $R_1$, $R_2$ and $R_3$ are independently selected from the group consisting of phenyl, benzyl, and linear or branched $C_1$-$C_5$ alkyl; and $X^-$ is an anion selected from the group consisting of $Br^-$, $Cl^-$, $I^-$, $F^-$ and $OH^-$.

The present invention further provides a chemical mechanical polishing composition comprising: water; 5 to 25 wt % of a colloidal silica abrasive; a pH adjusting agent; optionally a biocide; a pH of 8-13; 0.001 to 1 wt % of a quaternary ammonium compound having formula (I):

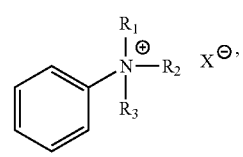

(I)

wherein $R_1$, $R_2$ and $R_3$ are independently selected from the group consisting of phenyl, benzyl, and linear or branched $C_1$-$C_5$ alkyl; and $X^-$ is an anion selected from the group consisting of $Br^-$, $Cl^-$, $I^-$, $F^-$ and $OH^-$.

The present invention provides a method for chemical mechanical polishing of a substrate, comprising: providing a substrate, wherein the substrate comprises silicon oxide; providing a chemical mechanical polishing composition comprising: water; an abrasive; optionally a pH adjusting agent; optionally a biocide; a pH greater than 7; a quaternary ammonium compound having (I):

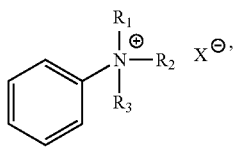

wherein $R_1$, $R_2$ and $R_3$ are independently selected from the group consisting of phenyl, benzyl, and linear or branched $C_1$-$C_5$ alkyl; and $X^-$ is an anion selected from the group consisting of $Br^-$, $Cl^-$, $I^-$, $F^-$ and $OH^-$;
providing a chemical mechanical polishing pad with a polishing surface; creating dynamic contact at an interface between the polishing surface of the chemical mechanical polishing pad and the substrate with a down force of 3 to 35 kPa; and dispensing the chemical mechanical polishing composition onto the chemical mechanical polishing pad at or near the interface between the chemical mechanical polishing pad and the substrate; and wherein some of the silicon oxide is removed from the substrate.

The chemical mechanical polishing composition and method of the present invention enable enhanced reduction of defects and enable good silicon oxide removal rate.

DETAILED DESCRIPTION OF THE INVENTION

As used throughout this specification the following abbreviations have the following meanings, unless the context indicates otherwise: L=liters; mL=milliliters; kPa=kilopascal; Å=angstroms; nm=nanometers; min=minute; rpm=revolutions per minute; wt %=percent by weight; RR=removal rate; mmol=millimoles; $Br^-$=bromide; $Cl^-$=chloride; $I^-$=iodide; $F^-$=fluoride; $OH^-$=hydroxide; PS=Polishing Slurry of the Invention; PC=Comparative Polishing Slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The terms "quaternary ammonium compound" and "quaternary ammonium salt" are used interchangeably in the specification because the quaternary ammonium compounds are water-soluble or water-dispersible salts. The term "TEOS" means the silicon oxide formed from the decomposition of tetraethyl orthosilicate ($Si(OC_2H_5)_4$). The term "composition" and "slurry" are used interchangeably through-out the specification. The term "halide" means chloride, bromide, fluoride and iodide. The terms "a" and "an" refer to both the singular and the plural. All percentages are by weight, unless otherwise noted. All numerical ranges are inclusive and combinable in any order, except where it is logical that such numerical ranges are constrained to add up to 100%.

The chemical mechanical polishing composition of the present invention is useful for polishing a substrate comprising silicon oxide. The chemical mechanical polishing composition comprises (preferably consists of): water; an abrasive; optionally a pH adjusting agent; optionally a biocide; a pH greater than 7; and a quaternary ammonium compound for reducing defects and enhancing the removal rate of silicon oxide from a substrate having formula (I):

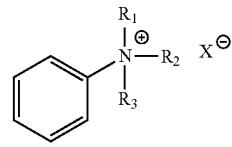

wherein $R_1$, $R_2$ and $R_3$ are independently selected from the group consisting of phenyl, benzyl, and linear or branched $C_1$-$C_5$ alkyl; and $X^-$ is an anion selected from the group consisting of $Br^-$, $Cl^-$, $I^-$, $F^-$ and $OH^-$. Mixtures of quaternary ammonium compounds of the present invention can also be included in the chemical mechanical polishing compositions of the present invention.

The term "enhanced silicon oxide removal rate" used herein describes the removal rate of silicon oxide (for removal rate measured in Å/min) resulting from polishing a substrate with the chemical mechanical polishing composition containing a quaternary ammonium compound with a phenyl group means that at least the following expression is satisfied:

$$A > A_0$$

wherein A is the silicon oxide removal rate in Å/min for a chemical mechanical polishing composition containing a claimed quaternary ammonium compound used in the method of the present invention of polishing a substrate, as measured under the polishing conditions set forth in the Examples; $A_0$ is the silicon oxide removal rate in Å/min obtained under identical conditions with only silica abrasives present.

The term "improved polishing defectivity performance" used herein describes the defectivity performance obtained through the inclusion of a quaternary ammonium compound having formula (I) in the chemical mechanical polishing composition used for the chemical mechanical polishing method of the present invention means that at least the following expression is satisfied:

$$X < X_0$$

wherein X is the defectivity (i.e., post CMP/hydrogen fluoride (HF) scratches or defects) for a chemical mechanical polishing composition containing the substances used in the method of the present invention, as measured under the polishing conditions set forth in the Examples; and $X_0$ is the defectivity (i.e., post CMP/hydrogen fluoride scratches or defects) obtained under identical conditions with only silica abrasives present.

Preferably, the chemical mechanical polishing compositions of the present invention include a quaternary ammonium compound having formula (I) in amounts of 0.001 to 1 wt %, more preferably, from 0.1 to 1 wt %, most preferably, from 0.1 to 0.5 wt %.

Preferably, the quaternary ammonium compound of the present invention has the formula (I):

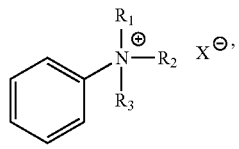

wherein $R_1$, $R_2$ and $R_3$ are independently selected from the group consisting of phenyl and $C_1$-$C_2$ alkyl and $X^-$ is an anion selected from the group consisting of $Br^-$, $Cl^-$ and $OH^-$; more preferably, $R_1$, $R_2$ and $R_3$ are independently selected from the group consisting of $C_1$-$C_2$ alkyl and $X^-$ is selected from the halide consisting of $Br^-$ and $Cl^-$; most preferably, $R_1$, $R_2$ and $R_3$ are $C_1$ alkyl or methyl (—$CH_3$) and $X^-$ is selected from the halide consisting of $Br^-$ and $Cl^-$. Mixtures of the preferred quaternary ammonium compounds can also be included in the chemical mechanical polishing compositions of the present invention.

Exemplary quaternary ammonium compounds of the foregoing preferred quaternary ammonium compounds are the quaternary ammonium salts selected from the group consisting of phenyltrimethylammonium chloride, phenyltrimethylammonium bromide and phenyltrimethylammonium hydroxide. The most preferred quaternary ammonium salts are selected from the group consisting of phenyltrimethylammonium chloride and phenyltrimethylammonium bromide. Mixtures of such quaternary ammonium salts can be included in the chemical mechanical polishing compositions of the present invention.

The water contained in the chemical mechanical polishing composition used in the chemical mechanical polishing method of the present invention is preferably at least one of deionized and distilled to limit incidental impurities.

The chemical mechanical polishing composition used in the chemical mechanical polishing method of the present invention contains 0.1 to 40 wt % abrasive; preferably, 5 to 30 wt % abrasive, more preferably, 10 to 20 wt %. The abrasive used preferably has an average particle size of <200 nm; more preferably 75 to 150 nm; most preferably 100 to 150 nm.

Abrasives for use in the chemical mechanical polishing composition used in the chemical mechanical polishing method of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations thereof. Modified forms of these inorganic oxides, such as, organic polymer coated inorganic oxide particles and inorganic coated particles can also be utilized if desired. Suitable metal carbides, borides and nitrides include, for example, silicon carbide, silicon nitride, silicon carbonitride (SiCN), boron carbide, tungsten carbide, zirconium carbide, aluminum boride, tantalum carbide, titanium carbide, or combinations thereof.

The preferred abrasive for use in the chemical mechanical polishing composition used in the chemical mechanical polishing method of the present invention is colloidal silica. Preferably, the colloidal silica used contains at least one of precipitated silica and agglomerated silica. Preferably, the colloidal silica used has an average particle size of <200 nm, more preferably, 75 to 150 nm, most preferably, 100 to 150 nm; and accounts for 0.1 to 40 wt %, preferably, 5 to 30 wt %, more preferably, 10 to 20 wt % of the chemical mechanical polishing composition. Examples of commercially available colloidal silica are Klebosol™ II 1630 colloidal silica with 139 nm average particle size; Klebosol™ II 1630 colloidal silica with 145 nm average particles size; and Klebosol™ II 1730 colloidal silica with 130 nm particle size all manufactured by Merck KgAA, Darmstadt, Germany, all available from DuPont.

Optionally, the chemical mechanical polishing composition contains biocides, such as KORDEK™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by International Flavors & Fragrances, Inc., (KATHON and KORDEK are trademarks of International Flavors & Fragrances, Inc.).

When biocides are included in the chemical mechanical polishing composition of the present invention, the biocides are included in amounts of 0.0001 wt % to 0.1 wt %, preferably, 0.001 wt % to 0.05 wt %, more preferably, 0.001 wt % to 0.01 wt %, still more preferably, 0.001 wt % to 0.005 wt %.

The chemical mechanical polishing composition used in the chemical mechanical polishing method of the present invention has a pH of >7, preferably 7 to 12, more preferably 10 to 11.

The chemical mechanical polishing composition used can optionally include one or more pH adjusting agent to maintain the pH within a preferred range. Preferably, the pH adjusting agent is chosen from one or more of sodium hydroxide, potassium hydroxide, and ammonium salt, such as an ammonium halide or nitrate.

The substrate polished in the chemical mechanical polishing method of the present invention comprises silicon oxide. The silicon oxide in the substrate includes, but is not limited to, borophosphosilicate glass (BPSG), plasma enhaned tetraethyl ortho silicate (PETEOS), thermal oxide, undoped silicate glass, high density plasma (HDP) oxide.

The chemical mechanical polishing pad used in the chemical mechanical polishing method of the present invention can by any suitable polishing pad known in the art. The chemical mechanical polishing pad can, optionally, be chosen from woven and non-woven polishing pads. The chemical mechanical polishing pad can be made of any suitable polymer of varying density, hardness, thickness, compressibility and modulus. The chemical mechanical polishing pad can be grooved and perforated as desired.

The quaternary ammonium compound having formula (I) contained in the chemical mechanical polishing composition used in the chemical mechanical polishing method of the present invention results in an improved polishing defectivity performance. Preferably, the inclusion of the quaternary ammonium compounds having formulae (I) in the chemical mechanical polishing compositions provides a >50% reduction in polishing defectivity (i.e., post CMP/hydrogen fluoride scratches), as measured under the polishing conditions set forth in the Examples. That is, the following equation is preferably satisfied:

$(X_0-X)/X_0*100>50;$ wherein X is the polishing defectivity (i.e., post CMP/hydrogen fluoride scratches or defects) for a chemical mechanical polishing composition containing the asymmetric quaternary ammonium compound according to formula (I) and used in the method of the present invention, as measured under the polishing conditions set forth in the Examples; and $X_0$ is the polishing defectivity (i.e., post CMP/hydrogen fluoride scratches or defects) obtained under identical conditions with only silica abrasives present.

The chemical mechanical polishing composition used in the chemical mechanical polishing method of the present invention enables operation with a low nominal polishing pad pressure, for example at 3 to 35 kPa. The low nominal polishing pad pressure improves polishing performance by reducing scratching and other undesired polish defects and minimizes damage to fragile materials.

The following examples are intended to illustrate the present invention but are not intended to limit its scope.

In the following Examples, unless otherwise indicated, conditions of temperature and pressure are ambient temperature and standard pressure.

The following materials were used in the Examples that follow:

The polishing removal rate experiments were performed on eight-inch blanket wafers. An Applied Materials Mirra® polisher was used for Examples 1 and an Applied Materials Reflexion® polisher was used for Examples 2. Polishing Example 1 was performed using an VisionPad 5000/K7™ polyurethane polishing pad and polishing Example 2 was performed using an IC1010 polyurethane polishing pad (both commercially available from Rohm and Haas Electronic Materials CMP Inc.) with a down force of 20.7 kPa (3 psi), a chemical mechanical polishing slurry composition flow rate of 150 mL/min in Example 1 and 250 mL/min in Example 2, a table rotation speed of 93 rpm and a carrier rotation speed of 87 rpm. The removal rates were determined by measuring the film thickness before and after polishing using a KLA-Tencor FX200 metrology tool. The defectivity performances reported in the Examples was determined using a Scanning Electron Microscope after a hydrogen fluoride post polishing wash ("Pst HF"). All the TEOS wafers after Pst-HF wash were inspected using a Surfscan® SP2 defect inspection system available from KLA-Tencor. The defects information, including their coordinates on the wafer, was recorded in KLARF (KLA Results File) which was then transferred to eDR-5200 defect review system available from KLA-Tencor. A random sample of 100 defect images were selected and reviewed by eDR-5200 system. These 100 images were classified into various defect types, for example, chatter marks (scratches), particles and pad debris. Based on classification results from these 100 images, the total number of scratches on the wafer was determined.

EXAMPLE 1

Chemical Mechanical Polishing Compositions, TEOS RR and Defect Reduction

Aqueous chemical mechanical polishing slurries were prepared as shown in Table 1 below. Aqueous 2 wt % KOH as added to each slurry to maintain the desired pH.

TABLE 1

| Slurry | Abrasive (wt %) | Tetraethyl-ammonium Hydroxide (wt %) | Phenyltrimethyl-ammonium Chloride (wt %) | pH |
|---|---|---|---|---|
| PC-1 | 16 | 0 | 0 | 10.7 |
| PC-2 | 16 | 0.34 | 0 | 10.7 |
| PS-1 | 16 | 0 | 0.4 | 10.7 |

Abrasive: Klebosol™ 111630 colloidal silica with 139 nm average particle size manufactured by Merck KgAA, Darmstadt, Germany, available from DuPont.

TABLE 2

| Slurry | TEOS RR | Pst-HF Defect Counts | Pst-HF Scratches |
|---|---|---|---|
| PC-1 | 2868 | 638 | 422 |
| PC-2 | 2938 | 247 | 161 |
| PS-1 | 2949 | 229 | 101 |

The slurry of the invention, PS-1, showed improved TEOS RR, reduced defect counts and reduced scratches in comparison to the two comparative slurries, PC-1 and PC-2.

EXAMPLE 2

Chemical Mechanical Polishing Compositions, TEOS RR and Defect Reduction

Aqueous chemical mechanical polishing slurries were prepared as shown in Table 3 below. Aqueous 2 wt % KOH as added to each slurry to maintain the desired pH.

TABLE 3

| Slurry | Abrasive (wt %) | Phenyltrimethyl-ammonium Chloride | pH |
|---|---|---|---|
| PC-3 | 15.5 | 0 | 10.7 |
| PS-2 | 15.5 | 0.36 | 10.7 |
| PS-3 | 15.5 | 0.24 | 10.7 |
| PS-4 | 15.5 | 0.48 | 10.7 |

Abrasive: Klebosol™ 111630 colloidal silica with 139 nm average particle size manufactured by Merck KgAA, Darmstadt, Germany, available from DuPont.

TABLE 4

| Slurry | TEOS RR | Pst-HF Scratches |
|---|---|---|
| PC-3 | 2899 | 311 |
| PS-2 | 3047 | 89 |
| PS-3 | 3001 | 81 |
| PS-4 | 3090 | 58 |

The slurries of the invention, PS-2, PS-3 and PS-4, which included phenyltrimethylammonium chloride exhibited enhanced TEOS RR and reduced scratches compared to the comparative, PC-3, which included only the abrasive and water.

What is claimed is:

1. A chemical mechanical polishing composition consisting of water; 10 to 20 wt % colloidal silica having a average particle size of 100 to 150 nm; optionally a pH adjusting agent; optionally a biocide; a pH of 10-12; and 0.1 to 0.5 wt % quaternary ammonium compound having formula (I):

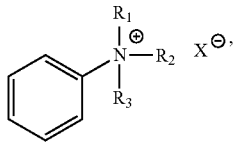

wherein $R_1$, $R_2$ and $R_3$ are independently selected from the group consisting of phenyl, benzyl, and linear or branched $C_1$-$C_5$ alkyl; and $X^-$ is an anion selected from the group consisting of $Br^-$, $Cl^-$, $I^-$, $F^-$ and $OH^-$.

2. The chemical mechanical polishing composition of claim 1, wherein the pH adjusting agent is selected from the group consisting of potassium hydroxide, sodium hydroxide, ammonium salt and mixtures thereof.

3. The chemical mechanical polishing composition of claim 1, wherein the quaternary ammonium compound has the formula (I):

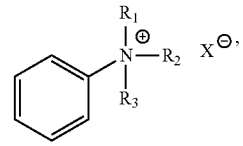

wherein $R_1$, $R_2$ and $R_3$ are independently selected from the group consisting of $C_1$-$C_2$ alkyl and $X^-$ is an anion selected from the group consisting of $Br^-$, $Cl^-$ and $OH^-$.

4. The chemical mechanical polishing composition of claim 1, wherein the quaternary ammonium compound of formula (I) is selected from the group consisting of phenyltrimethylammonium chloride, phenyltrimethylammonium bromide, phenyltrimethylammonium hydroxide and mixtures thereof.

* * * * *